United States Patent
Kamada

(10) Patent No.: US 6,622,306 B1
(45) Date of Patent: Sep. 16, 2003

(54) INTERNET TELEVISION APPARATUS

(75) Inventor: Tomihisa Kamada, Tokyo (JP)

(73) Assignee: Access Co., Ltd., Tokyo (JP)

( * ) Notice: Subject to any disclaimer, the term of this patent is extended or adjusted under 35 U.S.C. 154(b) by 0 days.

(21) Appl. No.: 09/254,369

(22) PCT Filed: Sep. 17, 1997

(86) PCT No.: PCT/JP97/03273

§ 371 (c)(1),
(2), (4) Date: Mar. 4, 1999

(87) PCT Pub. No.: WO98/12871

PCT Pub. Date: Mar. 26, 1998

(30) Foreign Application Priority Data

Sep. 18, 1996 (JP) .............................. 8-246528

(51) Int. Cl.[7] .......................... H04N 7/173; G09G 5/00; G06T 5/00
(52) U.S. Cl. ...................... 725/109; 725/110; 725/112; 345/760; 345/854
(58) Field of Search ............... 725/109, 110, 725/112; 345/760, 854

(56) References Cited

U.S. PATENT DOCUMENTS

| | | | | |
|---|---|---|---|---|
| 5,903,816 A | * | 5/1999 | Broadwin et al. | 348/565 |
| 5,930,808 A | * | 7/1999 | Yamanaka et al. | 707/501.1 |
| 5,963,950 A | * | 10/1999 | Nielsen et al. | 707/102 |
| 6,025,837 A | * | 2/2000 | Matthews et al. | 345/721 |
| 6,034,689 A | * | 3/2000 | White et al. | 345/760 |
| 6,314,570 B1 | * | 11/2001 | Tanigawa et al. | 345/841 |

FOREIGN PATENT DOCUMENTS

| | | |
|---|---|---|
| EP | 0 723 369 A | 7/1996 |
| JP | 5-56405 | 3/1993 |
| JP | 5-181584 | 7/1993 |
| JP | 5-189152 | 7/1993 |
| JP | 6-289996 | 10/1994 |
| JP | 7-193756 | 7/1995 |
| JP | 9-91188 | 4/1997 |
| JP | 9-91189 | 4/1997 |
| JP | 9-162818 | 6/1997 |
| JP | 9-163348 | 6/1997 |
| JP | 9-205497 | 8/1997 |

OTHER PUBLICATIONS

"Verknuepfung Von TV Mit Internet", Funkschau, Aug. 16, 1996, vol. 68, No. 18, pp 70/71, XP000631189.

A. Davison, "Clickable Images in HTML", Dr. Dobbs Journal, Sep. 1, 1995, vol. 20, No. 9, XP000562505.

* cited by examiner

Primary Examiner—John Miller
Assistant Examiner—Michael W. Hoye
(74) Attorney, Agent, or Firm—Dellett and Walters

(57) ABSTRACT

An internet television apparatus which has an internet connecting capability, comprising a means for storing an HTML document received from a Web server, a means for interpreting the HTML document and develops an image on an image memory, a display device on which the developed image is displayed, a means for recognizing anchor tags existing in the HTML document to detect mutual positional relationship among hot spots, corresponding to the recognized anchor tags, on the browser screen so as to generate a transfer list which defines the positional-relationship, and a control means for determining to which hot spot a focus is to be transferred next from a currently focussed hot spot by referring to the transfer list on the basis of the currently focussed hot spot and a user's operation to the operation key or keys for indicating at least four directions, and for transferring the focus onto the determined hot spot.

19 Claims, 15 Drawing Sheets

HTML DOCUMENT
"aaa.html"

```
<HTML>
 <HEAD>
 <TITLE>TITLE</TITLE>
 </HEAD>
 <BODY>
  This is a body.
  . . . . .
 <A HREF="bbb.html">BBB</A>
  . . .

<A HREF="ccc.html"><IMAG
 SRC="ggg.gif"></A>
  . . .

</BODY>
</HTML>
```

BROWSER SCREEN

FIG.14

| HOT SPOTS | COORDINATES OF DIAGONAL POINTS | POINTERS | | | |
|---|---|---|---|---|---|
| | | ← | → | ↑ | ↓ |
| A | x1a, y1a, x2a, y2a | — | D | — | B |
| B | x1b, y1b, x2b, y2b | — | E | A | C |
| C | x1c, y1c, x2c, y2c | — | E | B | — |
| D | x1d, y1d, x2d, y2d | A | F | — | E |
| E | x1e, y1e, x2e, y2e | B | F | D | — |
| F | x1f, y1f, x2f, y2f | D | — | — | G |
| G | x1g, y1g, x2g, y2g | E | — | F | — |
| ⋮ | ⋮ | ⋮ | ⋮ | ⋮ | ⋮ |

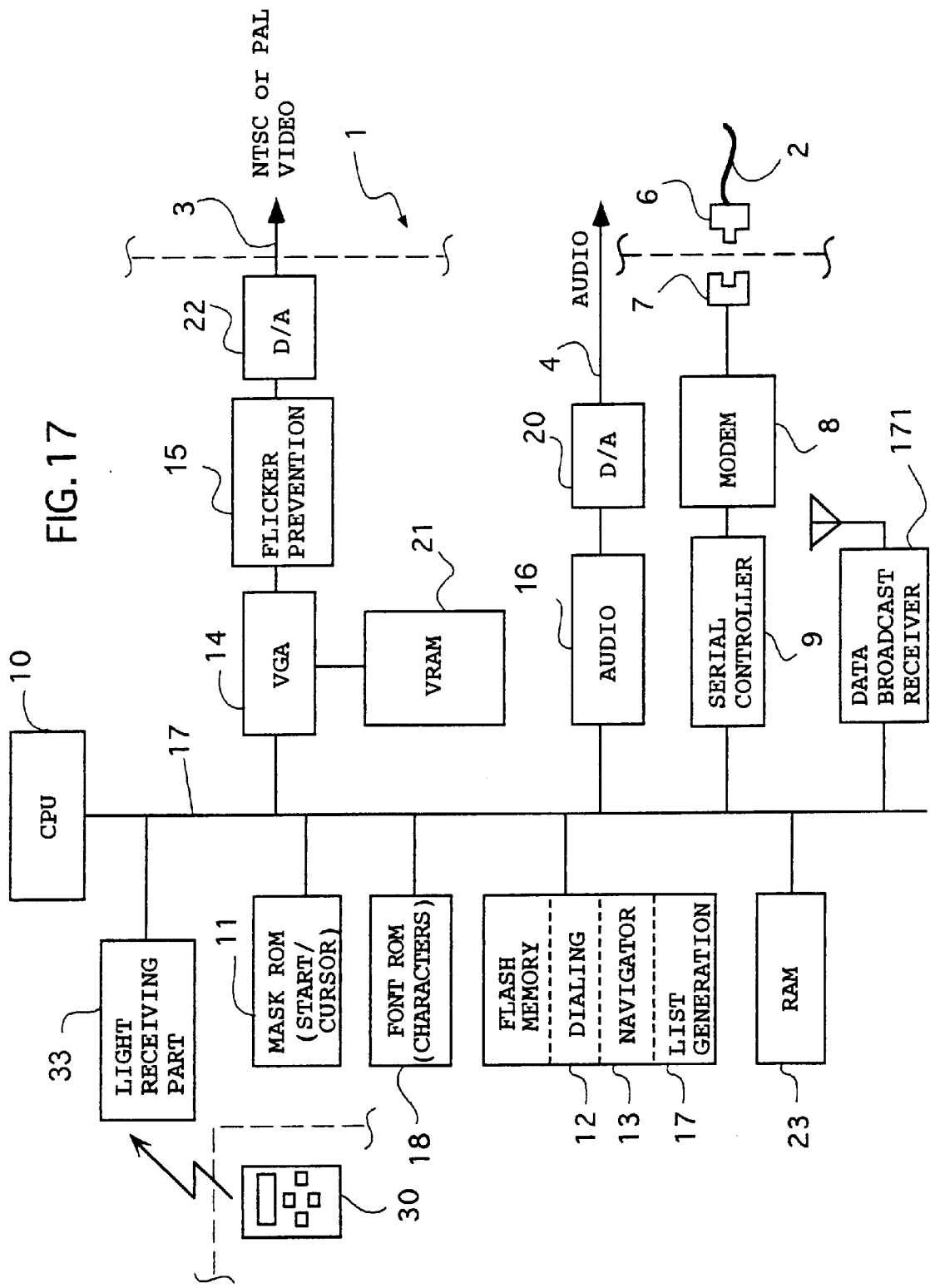

INTERNET TELEVISION APPARATUS

TECHNICAL FIELD

The present invention relates to an internet television apparatus (although, not limited to this) wherein an external internet unit or an internal internet circuit is added to a television apparatus, and more particularly to an apparatus which allows a user to specify a selectable item or a so-called hot spot on a home page of the Internet, with a cursor motion key of a remote controller.

BACKGROUND ART

Conventionally, in order to access the Internet, it has ordinarily been necessary for a user to use a personal computer and have at least minimum knowledge about computers. Especially, it has been required to use a keyboard for operation, which has been difficult for users who are not familiar with the keyboard. Therefore, internet participants tended to be limited to specialists, and the situation is far from that a lot of people can widely participate in the Internet.

A simple hardware configuration to access the Internet is to use a video game machine. In this case, the operation is performed by a controller attached to the game machine. This controller permits a remote control of the machine but a cable wire has to be used due to the original purpose of the game machine. Since the controller has to be operated by both hands, the operation is troublesome, inconvenient in dragging the cable, and not easy.

Therefore, it is desirable to be able to access the Internet through the use of a television apparatus which widely spreads over every family and to perform an operation by using a remote controller attached to the television apparatus.

A personal computer offers an operation to click on a hot spot by using a pointing device like a mouse, while a wireless remote controller of a television apparatus does not permit such an operation. Therefore, an operation equivalent to the clicking operation on the hot spot is achieved by displaying a cursor on a Web browser screen of the Internet displayed on the television, moving the cursor in a desired direction by an arrow key of the remote controller to superimpose the cursor on a target hot spot, and further, pressing a predetermined button in this state. However, it is quite troublesome and also time-consuming to accurately control the cursor by the key operation, and hence, this is not practical.

Therefore, it is an object of the present invention to provide a method and a device which allows a user to easily specify a hot spot on a browser screen by using a remote controller of a television apparatus or the like.

DISCLOSURE OF INVENTION

The present invention provides an internet television apparatus having an internet connecting capability, comprising: means for connecting to a Web server of the Internet; means for storing an HTML document received from the Web server; means for interpreting the HTML document and developing an image on an image memory; a display device for displaying the developed image thereon; a wireless remote controller having an operation key or keys for indicating at least four directions for remotely controlling the internet television apparatus; means for recognizing anchor tags existing in the HTML document to detect mutual positional relationship among hot spots, corresponding to the recognized anchor tags, on the browser screen so as to generate a transfer list which defines the positional relationship; and a control means for determining to which hot spot a focus is to be transferred next from a currently focussed hot spot by referring to the transfer list on the basis of the currently focussed hot spot and a user's operation to the operation key or keys for indicating at least four directions, and for transferring the focus to the determined hot spot.

The present invention provides, from another point of view, an external device to be connected to the television apparatus for providing the same with an internet connecting capability, comprising: means for connecting to a Web server of the Internet; means for storing an HTML document received from the Web server; means for interpreting the HTML document and developing an image on an image memory; means for transmitting the developed image to the television apparatus; a wireless remote controller which has an operation key or keys for indicating at least four directions for remotely controlling the external device; means for recognizing anchor tags existing in the HTML document to detect mutual positional relationship among hot spots, corresponding to the recognized anchor tags, on the browser screen so as to generate a transfer list which defines the positional relationship; and a control means for determining to which hot spot a focus is to be transferred next from a currently focussed hot spot by referring to the transfer list on the basis of the currently focussed hot spot and a user's operation to the operation key or keys for indicating at least four directions, and for transferring the focus to the determined hot spot.

The internet television apparatus or the external device may be provided with means for receiving the HTML documents via a telephone line. Alternatively, it may be provided with means for receiving the HTML documents from a data broadcasting.

The focusing can be performed by displaying a cursor placed on a hot spot to be focussed on or displaying with an emphasis the hot spot to be focussed on.

Preferably, the remote controller for the external device is used in common with the television apparatus. The present invention, from yet another point of view, provides a method of transferring, by key operation, a focus among a plurality of hot spots on a browser screen displaying an HTML document on a device including a display for displaying the HTML document, comprising the steps of: receiving an HTML document; recognizing anchor tags existing in the HTML document received; detecting the mutual positional relationship among hot spots, corresponding to the recognized anchor tags, on a browser screen so as to generate a transfer list which defines the positional relationship; determining to which hot spot a focus is to be transferred next from a currently focussed hot spot by referring to the transfer list on the basis of the currently focussed hot spot and a user's operation to the operation key or keys for indicating at least four directions, and for transferring the focus to the determined hot spot.

The present invention also includes in its scope a storage medium in which a computer program for achieving such a method is stored. Such storage media include a semiconductor ROM, a CD-ROM, a floppy disk, a hard disk, etc.

According to the present invention, it is possible to let the focus on a hot spot directly jump among hot spots according to a transfer pattern based on an operation of the remote controller, so that any one of the hot spots on a home page may be selected to receive and display desired information.

Therefore, anybody who can operate a television apparatus can easily connect to the Internet and browse home pages.

BRIEF DESCRIPTION OF DRAWINGS

FIG. 14 shows an exemplary configuration of a cursor transfer list (table) in accordance with the present invention;

FIG. 17 is a block diagram showing a configuration of principal elements of a modified embodiment in accordance with the present invention.

BEST MODE FOR CARRYING OUT THE INVENTION

Preferred embodiments in accordance with the present invention will now be explained according to the drawings.

Figure 3:
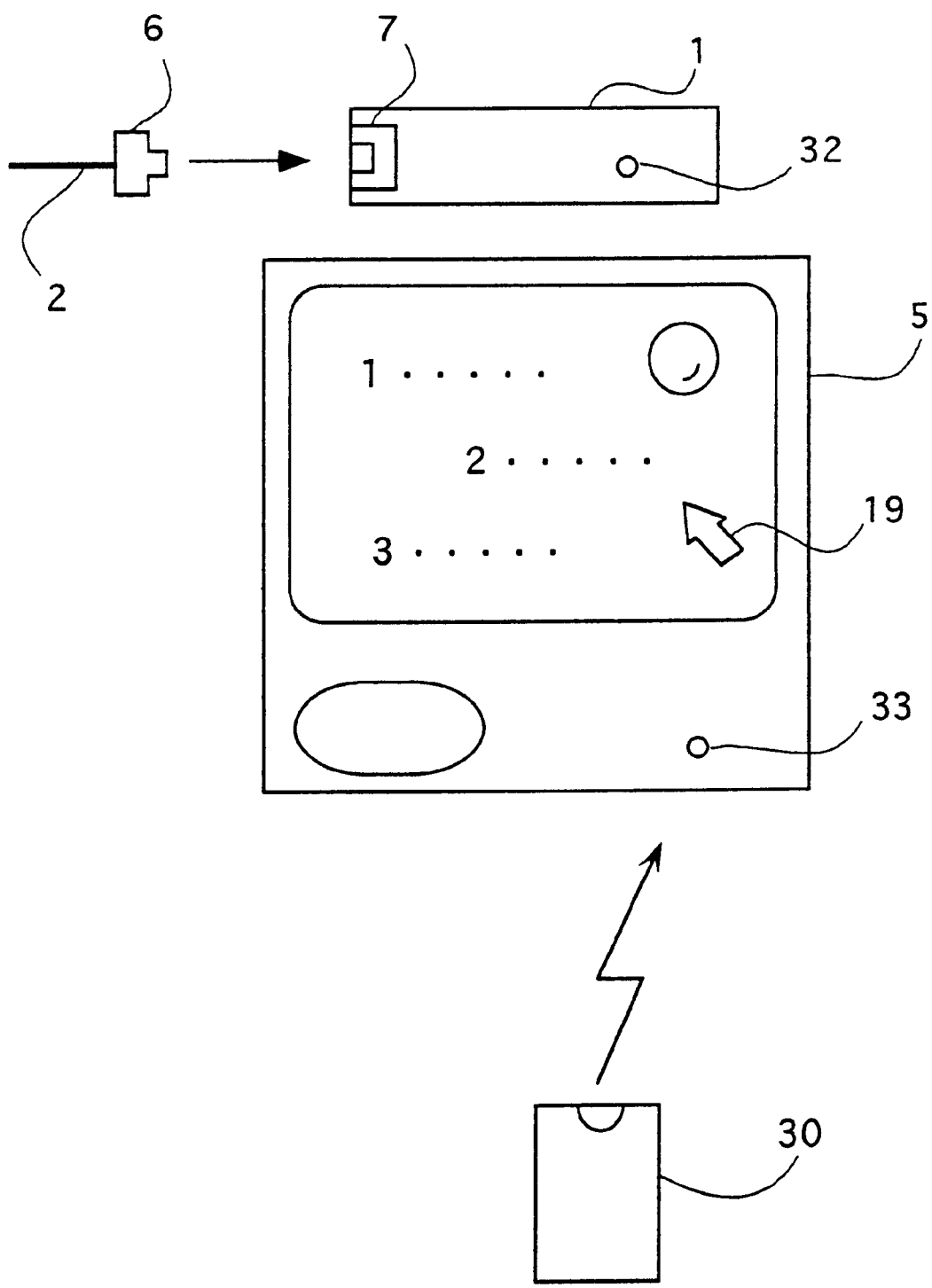
FIG. 3 shows an example of an external view of the internet television apparatus in a first embodiment in accordance with the present invention.
Figure 5:
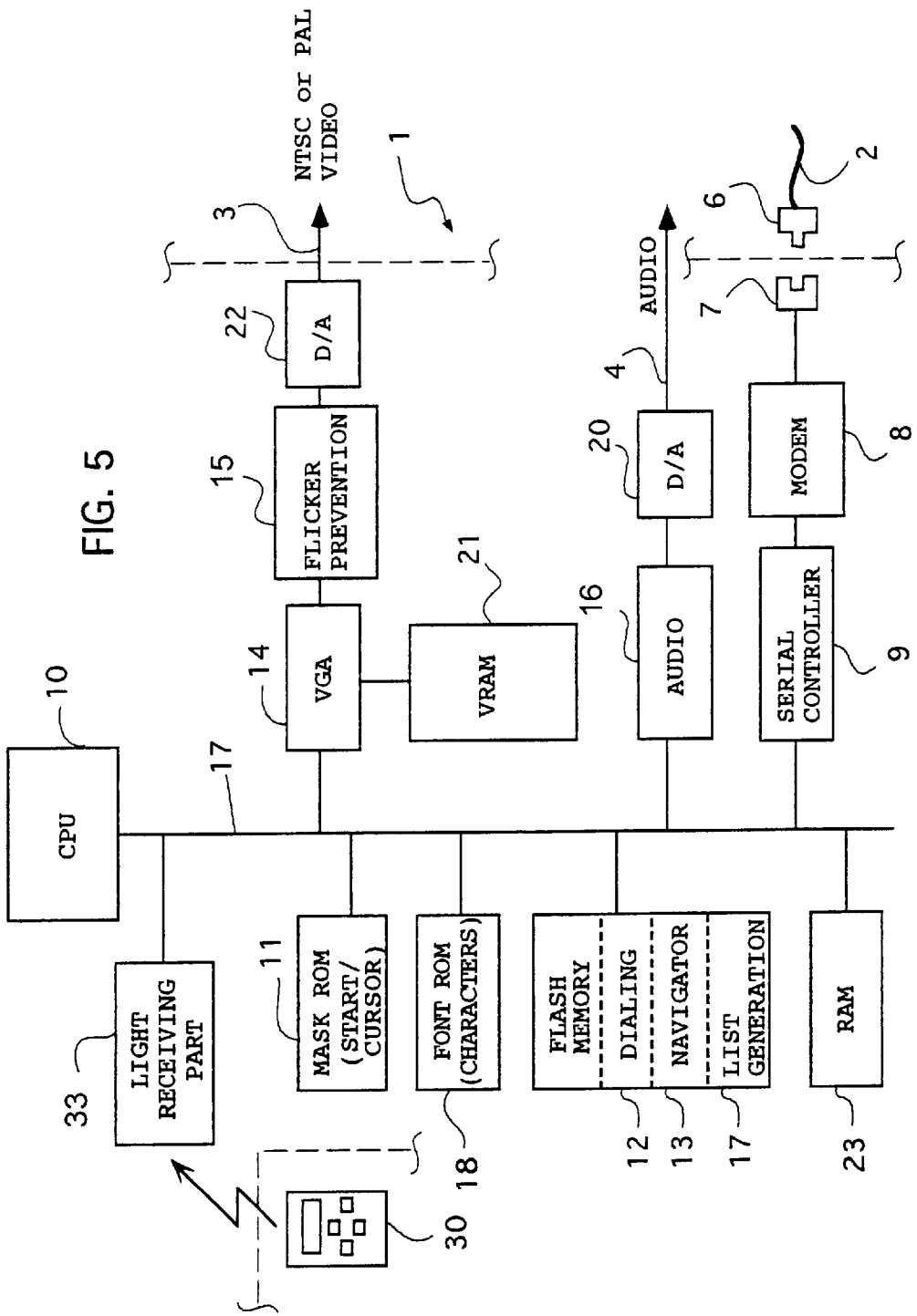
FIG. 5 is a block diagram showing a configuration of principal elements of the internet television apparatus (an external device) in the first embodiment in accordance with the present invention.

Referring first to FIGS. 3 and 5, a set-top-box type or external type internet television apparatus will be explained, which is a first embodiment of the present invention.

Referring to FIG. 3, an external type internet unit 1 is mounted on an ordinary television apparatus 5, and the internet unit 1 is provided with a modular jack 7 for receiving a telephone line 2. A modular plug 6 at an end of the telephone line 2 is connectable with the jack 7. The internet unit 1 and the television apparatus 5 are connected to each other by video and audio lines which will be described below. In this embodiment, the internet television apparatus is comprised of the television apparatus 5 and the internet unit 1.

An infrared receiving part 32 is provided on the front face of the internet unit 1 for receiving a signal projected from a light emitting part of a separate remote controller 30. The signal from this light emitting part can also be received by a light receiving part 33 of the television apparatus 5.

Referring to FIG. 5, an internal configuration of the internet unit 1 will be explained with reference to an example. The modular jack 7 of the internet unit 1 is connected with a modem 8 of the internet unit 1, which in turn forwards received data of a home page to a memory (RAM) 23 via a serial controller 9. This data is transferred from the RAM 23 to a transfer list generation unit 17, which will be described below.

A character font memory 18 and a read only memory (ROM) for storing a start-up program 11, a dialing program 12, a navigator program 13, a transfer list generation program 17, etc. are connected to a CPU 10 via a bus 17. These programs are stored in the same ROM or separate ROMs. As a preferred exemplary configuration, the start-up program 11 is stored in a mask ROM, while the dialing program 12, the navigator program 13, and the transfer list program 17 are stored in a flash memory which is a rewritable and nonvolatile memory. The character font memory 18 is composed of a mask ROM.

The start-up program, an initial image, etc. are prestored in the start-up program 11. A telephone number of an internet service provider and a procedure program are prestored in the dialing program 12. The character font memory 18 stores therein font patterns of characters and symbols, and the CPU 10 reads the font patterns of the characters from the character font memory 18 based on codes of these characters and symbols.

The navigator program 13 is a program which interprets home page data written in HTML (described below) to construct a display image, jumps to a linked destination, performs data communications with servers, and so on.

The transfer list generation program 17 detects selectable positions in a home page, namely, hot spots (usually represented by underlined characters or colored characters or framed pictures), and temporarily stores the detected results in the RAM 23. The transfer list generation program 17 extracts, from data of a home page changing page by page, a transfer pattern of a cursor corresponding to the home page.

Figure 1:
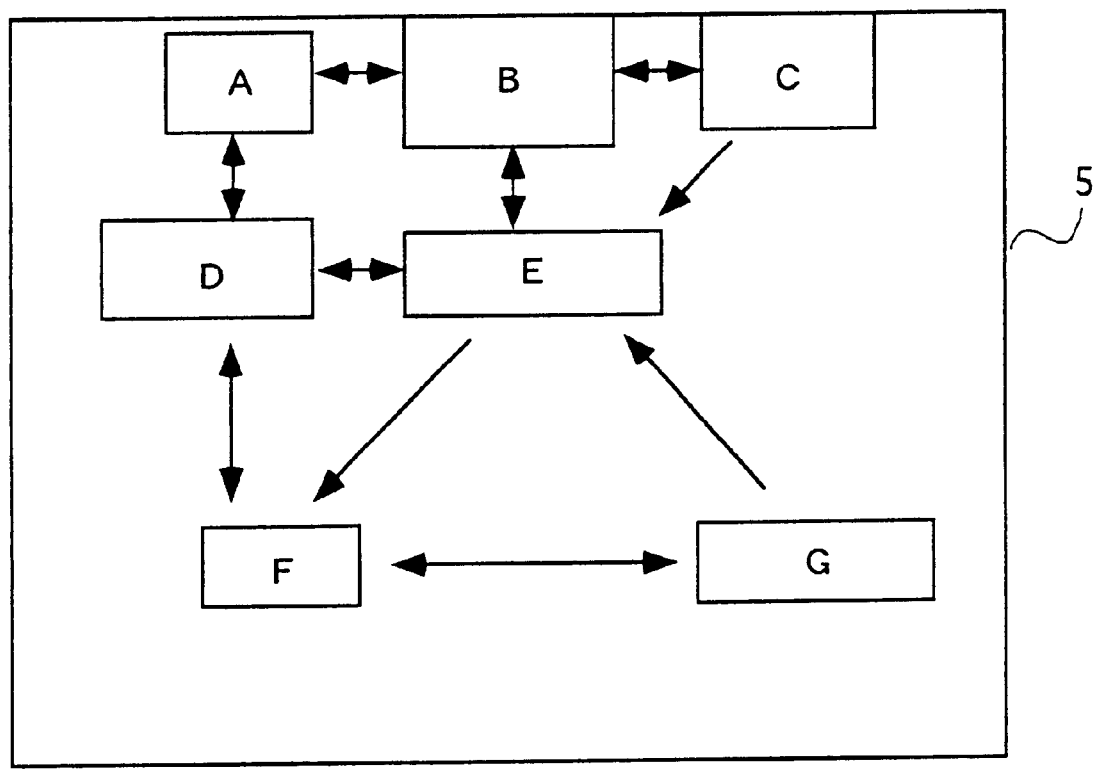
FIG. 1 is a diagram for explaining a transfer pattern of the internet television apparatus in accordance with the present invention.
Figure 7:
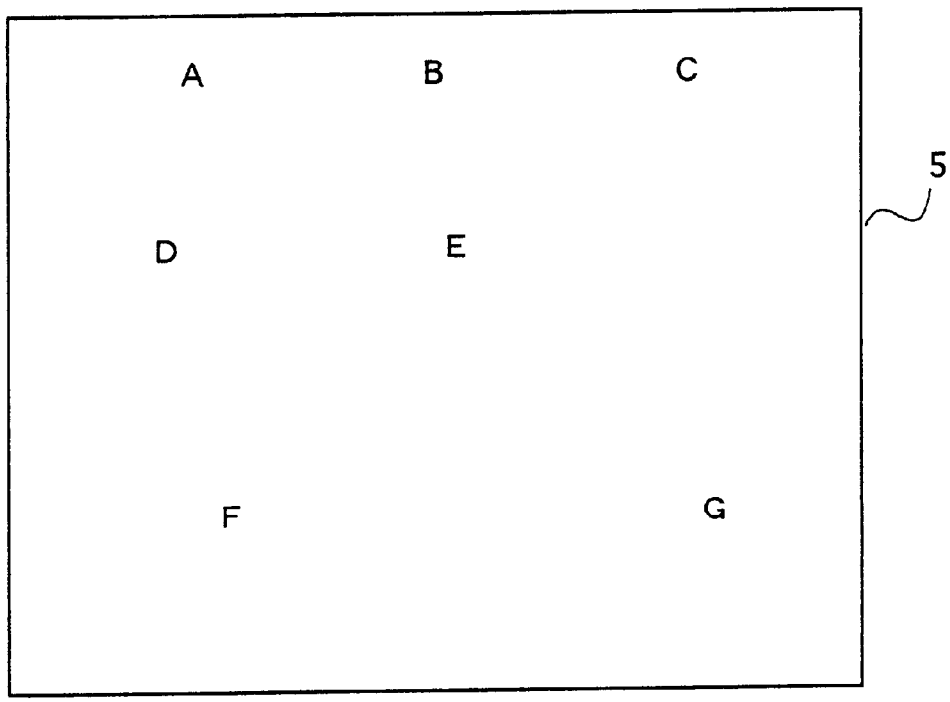
FIG. 7 is a diagram showing an example of positions of selectable candidate characters which represent hot spots on a home page.

To be more specific, the transfer list generation program 17 extracts a transfer pattern as shown in FIG. 1 from the home page data in which hot spots exist as shown in FIG. 7. This cursor transfer pattern defines, in this embodiment, corresponding relationships between a given hot spot and other hot spots to which a transfer can be made from the given hot spot in response to an operation of a cursor motion key 44 of the remote controller 30 as described below.

In this embodiment, a state in which the cursor 19 (FIG. 6) is placed on a selectable hot spot, is referred to as the hot spot being "focussed" on. Focusing may be realized not only by means of the cursor but also by means of an enhanced display like reversing, flickering, etc. In an example of FIG. 1, a transfer pattern of the cursor is defined as shown by arrows with respect to hot spots A, B, C, D, E, F, and G in a certain home page. For example, the cursor on a selectable candidate hot spot A moves onto the hot spot B in response to a "RIGHTWARD" indication of the cursor motion key 44 and moves onto the hot spot D in response to a "DOWNWARD" indication. The cursor on the hot spot G moves onto the hot spot F in response to a "LEFTWARD" indication, and onto the hot spot E in response to an "UPWARD" indication. The cursor on the hot spot E moves onto the hot spot D with a "LEFTWARD" indication, and moves onto the hot spot F with a "DOWNWARD" indication and onto the hot spot B with an "UPWARD" direction. Thus, it is possible for a user to directly transfer the cursor to one of the nearest hot spots from the current cursor position, namely, the focussed hot spot position, by using the cursor motion key 44, thereby improving an operability for the user. Detailed configuration and operation of such cursor transfer will be described below.

Referring back to FIG. 5, an audio controller 16 and a video control circuit 14 are connected with the CPU 10 via the bus 17, and the audio controller 16 generates phonemic data. This phonemic data is converted into an analog audio signal through a D/A converter circuit 20 and transmitted to an audio input of the television apparatus 5 through an audio line 4. Alternatively, sound is outputted by a built-in loudspeaker. The video control circuit (VGA) 14 converts digital data of character patterns and pictures sent from the CPU 10 into display signals (image data) by using a video RAM 21, and sends them to a flicker prevention circuit 15. The flicker prevention circuit 15 executes a scan conversion to prevent the video signals from flickering. The digital display signals from the flicker prevention circuit 15 are sent to a D/A converter circuit 22 for images. The D/A converter circuit 22 applies NTSC or PAL analog video signals to the television apparatus 5 via a video input line 3. The flicker prevention itself has nothing directly to do with the present invention but an arbitrary conventional method can be applied for the purpose of the flicker prevention.

Figure 2:
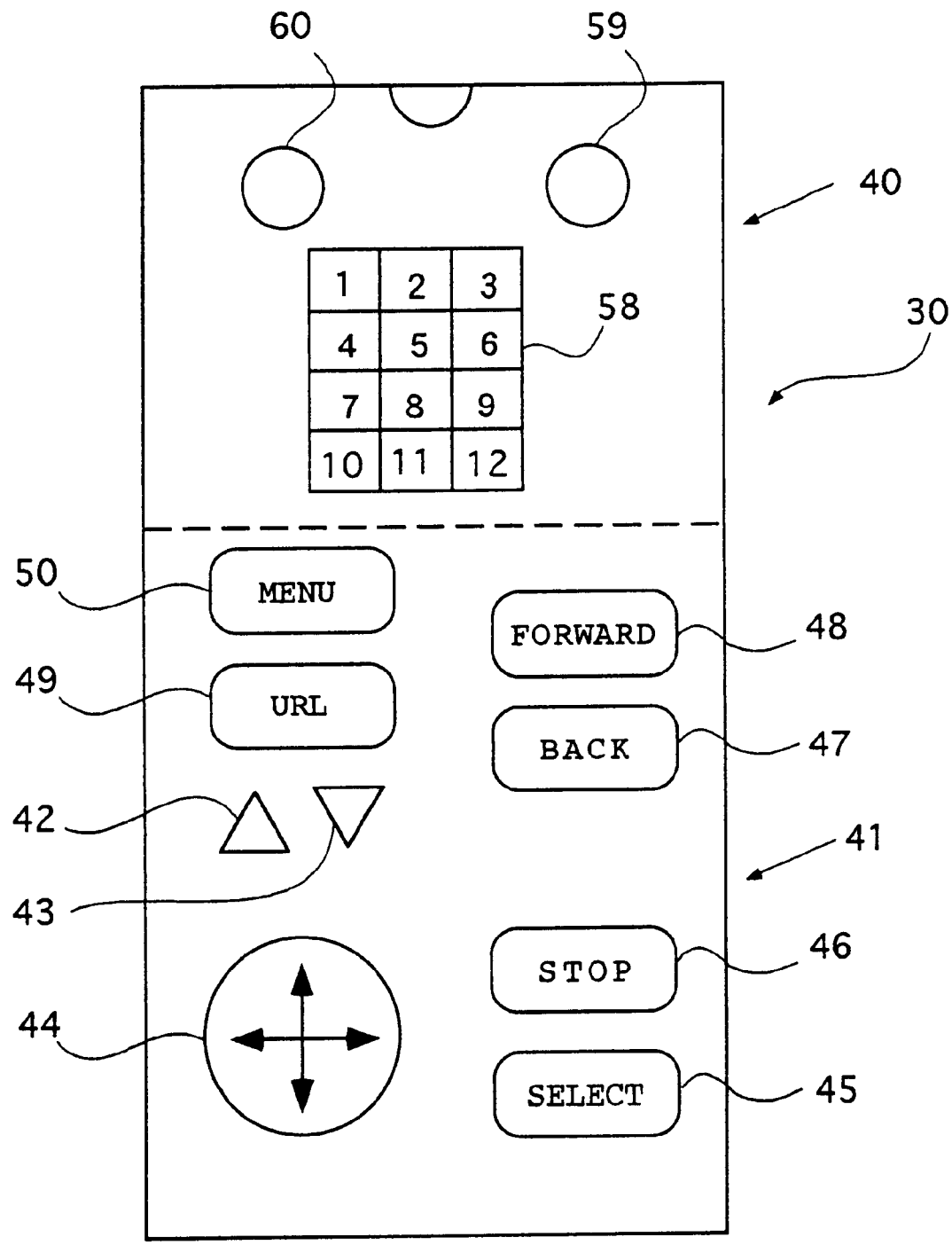
FIG. 2 is an external view of an example of the remote controller for the internet television apparatus in accordance with the present invention.

Referring next to FIG. 2, an exemplary configuration of the remote controller 30 will be described. In this illustrated example, on the upper half of the remote controller 30 are a group of switch buttons 40 of an ordinary television apparatus, including a power-on button 59, a VIDEO/TV change-over button 60, numeric channel buttons 58, etc. On the lower half are a group of switch buttons 41 for the Internet. The group of the switch buttons 41 includes a scroll-up button 42 and a scroll-down button 43 for scrolling an image up and down, a cursor motion key 44 for moving the cursor 19 vertically and horizontally on the screen, a selection button (SELECT) 45 for selecting a hot spot specified by the cursor 19 (for example, jumping to a linked location), a stop button (STOP) 46 for stopping an action or operation, a back button (BACK) 47 for returning to a previous page, a forward button (FORWARD) 48 for going ahead to a next page, a URL (address) button 49 for directly specifying a URL by using a software key board (not shown), and a menu button 50 for opening a menu screen.

The cursor motion key 44 may be configured so that it can instruct the cursor to move not only in the vertical and horizontal directions but also in the diagonal directions. Although only a single key is illustrated in the Figure, the cursor motion key may be a four-split configuration including up, down, right and left parts.

Now, configuration of home page information will be described. Home page information obtained from a Web server is written in the Hyper Text Markup Language (HTML). A document written in HTML, itself, is a text file including codes, called tags, each of which is enclosed by the symbols "<" and ">" to specify character modification information, layout information, etc. The navigator program 13 as a Web browser acts to interpret these tags to make a display of the HTML document.

The HTML document not only allows other texts, images, or audios to be inserted in the document but also allows individual parts of a particular HTML document to be linked with images or other HTML documents. Namely, the HTML document makes it possible to link (relate) a particular position (hot spot or anchor point) with another position, file, etc. in the same document, thereby allowing a prompt jump from that position to the linked position or location, and very efficient reading (browsing) of various documents (including what is called multi-media). Further, upon selection of a hot spot, it is possible to open a window for transmitting an electronic mail or start a specific function related to the hot spot. Thus, by setting hot spots to various items in an HTML document in advance and selecting such hot spots, a user can browse the documents corresponding to the hot spots or execute various functions corresponding to them.

Figures 13A, 13B:
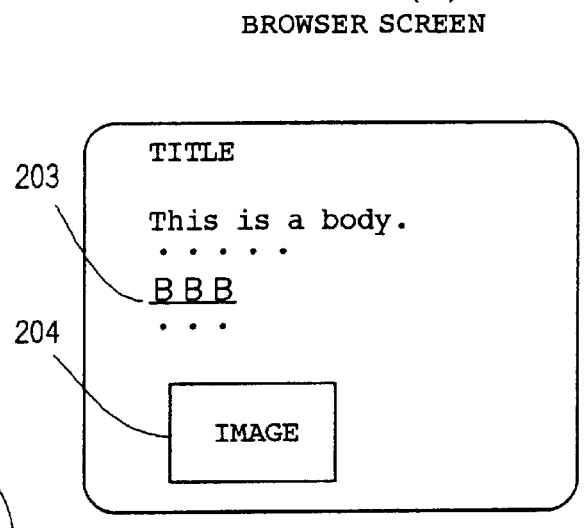
FIG. 13 is a diagram showing an HTML document configuration (a) and an example of its display (b)

In FIG. 13(*a*), a basic configuration of an HTML document is shown. The HTML document is, as mentioned above, substantially a text file but has embedded codes (sandwiched by symbols "<" and ">" ) dispersedly placed in the document. Usually, a specified range is held between a pair of tags, a starting tag "< . . . >" and an ending tag "</ . . . >". The ending tag includes "/" therein to be distinguished from the starting tag. However, the tags are sometimes used solely, like <P> which represents a paragraph change or <BR> which represents a line feed. In addition to the character modification information and layout information, link information can be set by the tags. The browser interprets these tags and displays the HTML document on a screen in the form intended by its creator and also controls the linking.

A basic configuration of an HTML includes various tags existing in the text document as shown in FIG. 13(*a*). When this HTML document is interpreted by the browser and displayed on a screen, the tags are not displayed as is evident from FIG. 13(*b*), but instead the display reflects only the instructed contents. A function is called link (or hyperlink) as mentioned above, which causes a jump to a location related to a specific character string in an HTML document when a user selects the specific character string, on which a hot spot is set. An HTML document "aaa.html" in FIG. 13(*a*) at a position 201 reads:

<A HREF="bbb.html">BBB</A>

The tags used for setting a link are called anchor tags (<A . . . >. . . </A>), the part held between the anchor tags being called a hot spot or anchor point. The term "HREF=" in the starting tag <A HREF="bbb.html"> of the anchor tags leads access information (here, a file name) of a location to be linked with the hot spot. In this anchor tag part, the character string "BBB" is highlighted on the browser screen as a display character string 203 in FIG. 13(*b*). This highlighted display can be achieved with a color differentiation from other character strings or with an addition of an underline. This allows a user to recognize that upon selecting that particular character string he or she can be transferred to another location.

The position 202 shows a case where a hot spot is set on an in-line image, and here an image file named "ggg.gif" is displayed as an image 204 on the screen, and when this image 204 is selected by a user, the contents of the linked destination "ccc.html" are fetched and displayed. The term "in-line image" refers to an image embedded in an HTML document for being displayed therein.

Figure 4:
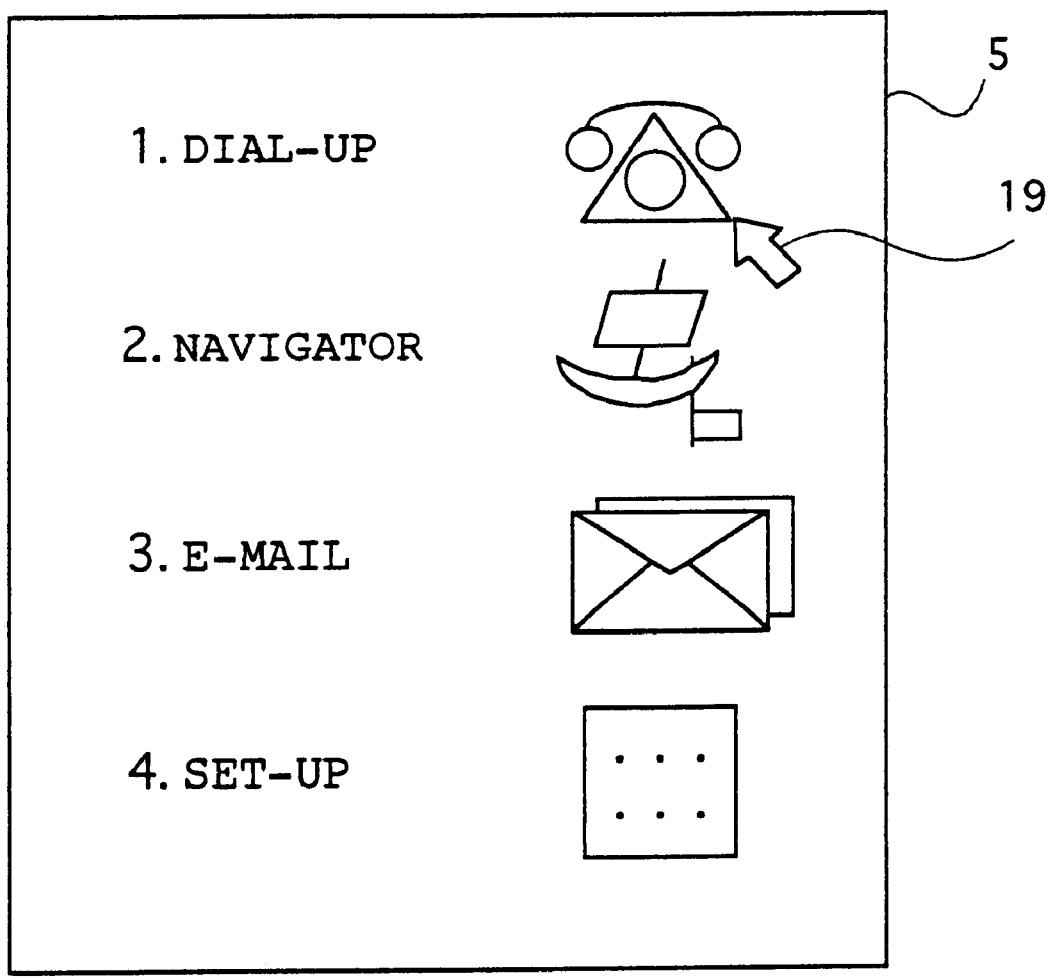
FIG. 4 is a diagram showing an example of an initial menu screen of the internet television apparatus in accordance with the present invention.

Referring to the block diagram shown in FIG. 5, the operation of a television apparatus shown in FIG. 3 will be described in the following. Now, assume that the jack 6 of the telephone line 2 is inserted into the jack 7 of the internet unit 1. When a user presses the power-on button 59 of the remote controller 30, the light receiving part 32 of the internet unit 1 receives this signal and the power of the circuit in the internet unit 1 is turned on. At the same time, the television apparatus 5 is also turned on by the same signal. Then, the start-up program 11 is activated, and the CPU 10 reads an initial menu screen data, for example, as shown in FIG. 4, to display the data on the display screen of the television apparatus 5.

The cursor 19 is arranged at first to be displayed at the hot spot position "1. DIAL-UP" on the FIG. 4 screen so that a beginner can readily start the internet communication. (However, this is only an example, and the initial position of the cursor may be anywhere.)

When a user presses the selection button 45 of the remote controller 30, the CPU 10 reads the telephone number of the provider along with the ID number and password of its own station from the dialing program 12 into the RAM 23, so as to instruct, through the serial controller 9, the modem 8 to execute dialing the telephone number of the provider. The modem 8 then dials the telephone number of the provider, and the line is connected between the internet television apparatus and the provider.

Then, the provider sends an inquiry for the ID number and password of the caller, to the internet television apparatus according to a predetermined protocol. The CPU responds to the inquiry according to the dialing program 12, and the provider and the internet unit 1 are brought into a state in which data communication is possible, with an icon or the like being displayed on a part of the television apparatus 5 for indicating the connected state.

When the user presses the menu button 50 of the remote controller 30 in the connected state of the line, the initial menu screen shown in FIG. 4 is displayed again on the television apparatus 5. When the "DOWNWARD" on the cursor transfer button 44 is pressed once, the cursor 19 is moved from "1. DIAL-UP" onto the character of "2. NAVI-GATOR" and stays thereon. When the selection button 45 is pressed, the navigator program 13 is activated so as to display a first home page picture.

Figure 6:
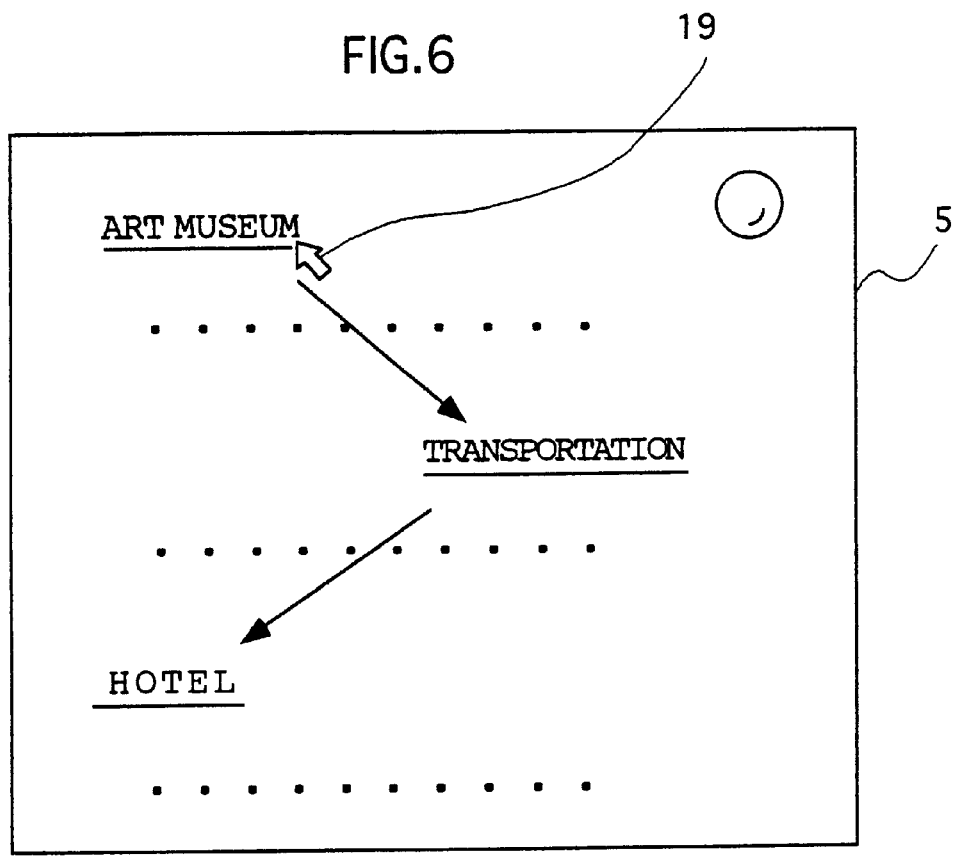
FIG. 6 is a diagram showing an example of a cursor transfer pattern corresponding to a home page in accordance with the present invention.

Referring next to FIG. 6, FIG. 7, and FIG. 1, an explanation will be given of an operation of transferring the cursor 19 using the cursor motion key 44.

The CPU 10 receives an HTML document corresponding to screen data of FIG. 6 from the Internet and stores the data in the RAM 23. Assume that this screen is, for example, a home page for guiding art museums in Shinshu. In FIG. 6, the character strings "ART MUSEUM", "TRANSPORTATION", and "HOTEL" set as hot spots are underlined in display. Information on which route of transportation to take, which hotel to stay at for visiting which art museum are obtained by sequentially specifying the hot spots on this screen. The transfer list program 17 can detect aforementioned anchor tags and recognize coordinate positions of respective hot spot areas on the display screen. These positions of the art museum, transportation, and hotel correspond to the hot spot positions A, B, C, D, E, F, G, etc. in FIG. 7. The respective hot spot areas are as shown in FIG. 1.

Now, on the picture of FIG. 6, assume that the cursor 19 is currently on the "ART MUSEUM" hot spot in the upper-left part of the screen, and for example, a user wants to look for a hotel. Then, when the user presses once "DOWNWARD" on the cursor transfer button 44, the cursor 19 jumps down to "TRANSPORTATION" first, and when he or she presses once again "DOWNWARD", the cursor jumps downward-left to the "HOTEL". Pressing the selection button 45 with the cursor 19 placed on the "HOTEL" will leads to, for example, a home page for a hotel guide.

If audio data of music or lady's voice come out in the home page of the hotel guide, the CPU 10 sends the audio data to the audio controller 16 in FIG. 5. The audio controller 16 decodes the audio data and applies the decoded data to the audio D/A converter circuit 20. The D/A converter circuit 20 converts the audio data into analog audio signals and applies them to a loudspeaker of the television apparatus 5 via the audio line 4. The picture data of the hotel guide home page are directly sent to the video control circuit 14. Regarding code data for the symbols and characters, their corresponding pattern data are fetched from the character font memory 18 and sent to the video control circuit 14. The video control circuit 14 generates display screen data from the picture data and pattern data by using the video RAM 21, and applies the display screen data to the flicker prevention circuit 15. The screen data are subjected to a flicker prevention processing by the flicker prevention circuit 15 and applied to the D/A converter circuit 22. The D/A converter circuit 22 converts the display screen data into analog signals and applies the analog NTSC or PAL signals to the video circuit of the television apparatus 5 via the video line 3.

On a screen (not shown) displayed when the "3. E-MAIL" is selected in FIG. 4, it is required to input characters and symbols such as a keyword and Web addresses. For this purpose, although any hardware equivalent to a keyboard for a personal computer is required, a virtual keyboard (keyboard image) or the like is displayed on the screen of the television apparatus 5 upon pressing the URL (address) button 49 of the remote controller 30 in FIG. 2. The data received from the Internet are sequentially stored in the RAM 23. However, since an image corresponding to the data sometimes does not fit into one screen, the pressing of the scroll up and down buttons 42, 43 permits the user to scroll back to previous displays for review.

When ending the internet communication, the disconnection can be made by an operation from an unshown menu.

Figure 15:
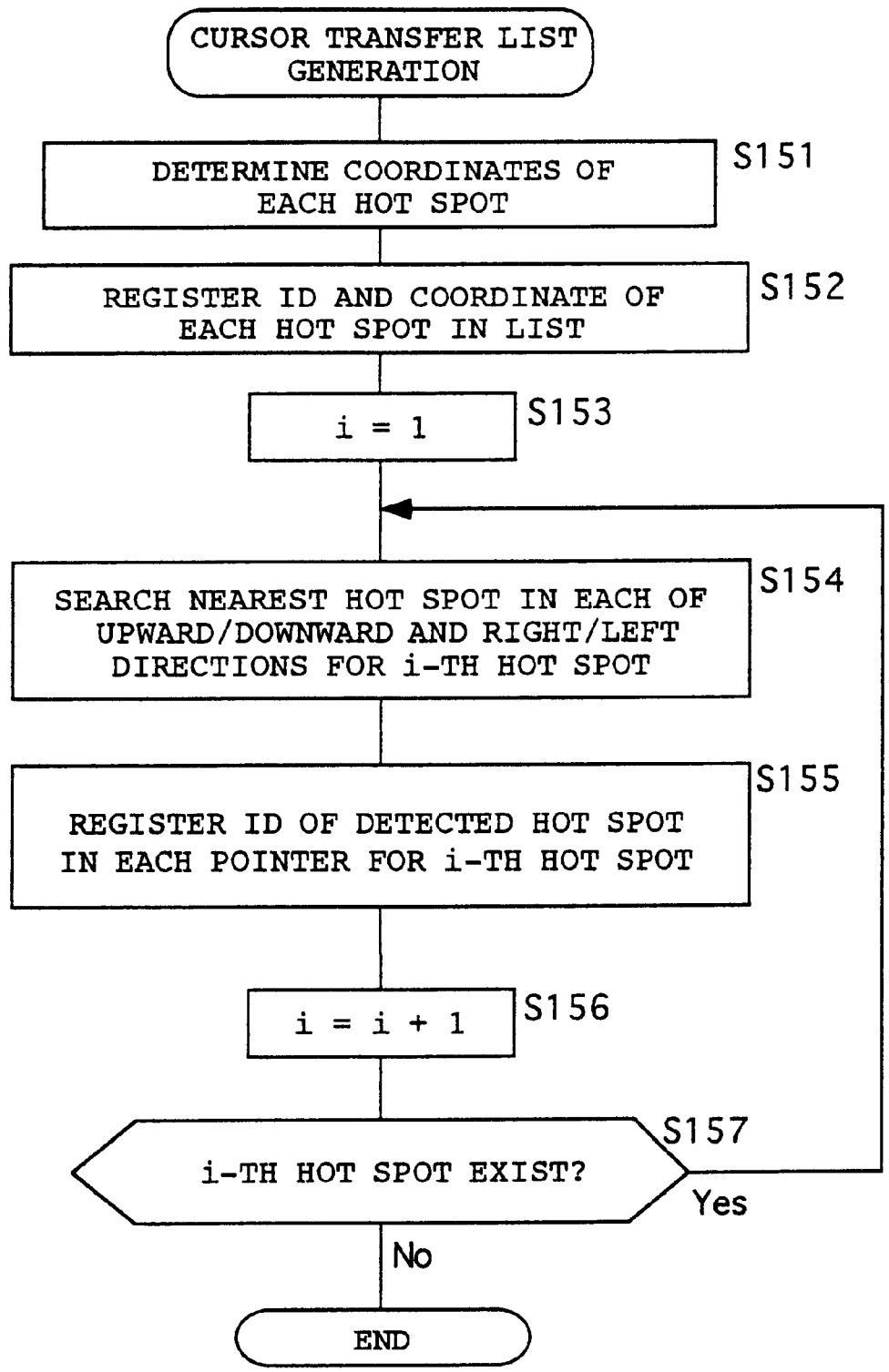
FIG. 15 is a flow chart showing an exemplary processing procedure for generating the cursor transfer list as shown in FIG. 14.
Figure 16:
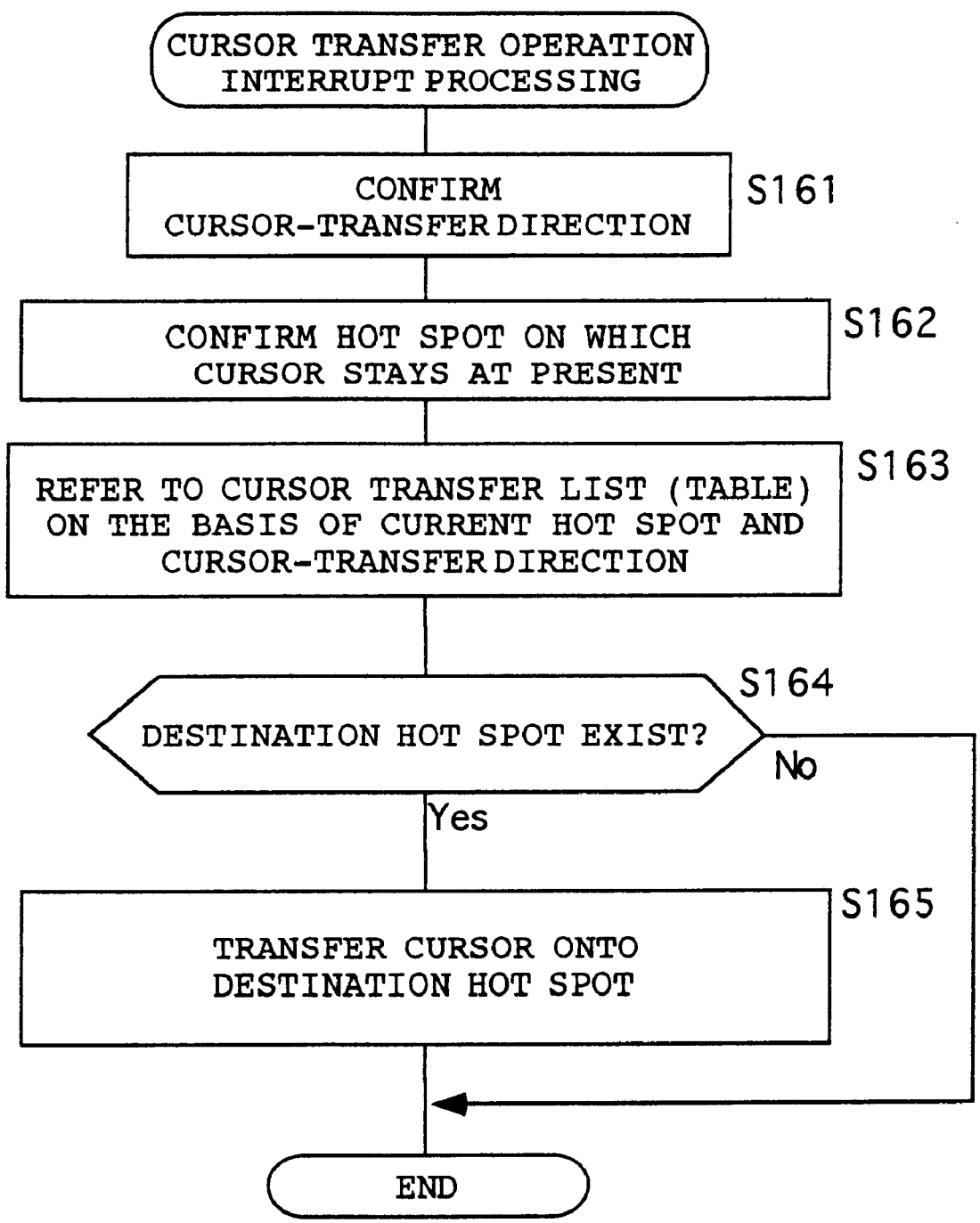
FIG. 16 is a flow chart showing an example of an interruption processing executed based on the cursor transfer list of FIG. 14 upon a user's cursor operation.

Referring now to FIG. 14 through FIG. 16, a specific method for achieving the hot spot focusing with the cursor motion key 44 as described above.

FIG. 14 shows a specific example of the cursor transfer list (also referred to as a transfer pattern table) 140 which defines the cursor transfer pattern among the hot spots on a home page. This cursor transfer list 140 specifies, with respect to a plurality of hot spots in a home page, their names (or their IDs) 141, coordinates 142 of the diagonal points (upper-left and lower-right in this example) of each area of the hot spots, and pointers 143 which point destination hot spots to which the cursor jumps in response to respective indications of up, down, right and left directions of the cursor motion key 44. This cursor transfer list 140 is generated when an HTML document (text file, in-line image data, etc.) for a home page has been received, interpreted, and developed as an image.

FIG. 15 shows an example of specific procedures for generating the cursor transfer list.

All hot spots in a home page are detected at the time of interpreting an HTML document to be displayed, and the coordinates of the diagonal points in each area are determined (S151). These coordinates are those on a home page image developed on the VRAM 21, and for example, the upper-left corner of the home page image is defined as the origin.

The coordinates of the detected hot spots and their names (which may alternatively be IDs like serial numbers) are registered (S152) in columns "HOT SPOTS" 141 and "COORDINATES" 142 of the cursor transfer list 140, respectively. At this stage, a column "POINTERS" 143 of the cursor transfer list 140 in FIG. 14 is still blank.

Then, a loop variable i is set with "1" (S153). The value of this loop variable i corresponds to a serial number of the hot spots in the home page.

Next, for each hot spot, the data for the pointer 143 are sequentially determined and registered in the list 140 in the loop processing of the subsequent steps S154 to S157.

Firstly, regarding an i-th hot spot, a hot spot vertically and horizontally nearest to the i-th hot spot on the developed image is searched (S154). Various search methods may be considered. In the present embodiment, with respect to the left and right directions, a search for another hot spot is made in the respective directions from a representative point (e.g., the center of the area, the upper-left corner, etc.) of the current i-th hot spot. If such a hot spot is found that has a y-coordinate range within which the y-coordinate of the representative point falls, then the hot spot is determined as the destination hot spot in that direction. If a plurality of such hot spots exist, the nearest hot spot to the i-th hot spot is selected as the destination. With respect to the up and down directions, a hot spot having the nearest x-coordinate among the hot spots having y-coordinates near to the i-th hot spot is selected as the destination. This hot spot is registered in the pointer 143 of the i-th hot spot (S155). Referring again to FIG. 1 and considering, for example, the hot spot A on the screen, it is judged from the coordinates of each hot spot that no other hot spot exists in the upward direction. Therefore, a code "-" indicating non existence is registered in a column "↑" of the pointers 143 in the list 140. In the downward direction of the hot spot A, a plurality of hot spots, D and E, are detected as those having close y-coordinates, but the hot spot D nearest to the hot spot A is selected and the name "D" is registered in a column "↓" of the pointers 143. Similarly, the code "-" is registered in a column "←" of the pointers 143, and "B" in a column "→".

When all the pointer data in every direction have been registered regarding the i-th hot spot, i is incremented (S156). If this new i-th hot spot is present (S157), then the procedure returns to step S154 and repeats the above-described processing. In this way, the transfer list 140 as shown in FIG. 14 is completed with respect to all the hot spots in a home page.

If the i-th hot spot is not present at the previous step S157, this cursor transfer list generation procedure is ended.

FIG. 16 shows an example of the processing for using the cursor transfer list 140 generated in such a manner. This processing is an interruption processing of the CPU which is activated, in the present embodiment, when the cursor motion key 44 is operated.

Upon activation of the interruption processing, a check is first made to find which direction the cursor key 44 indicates (S161). Next, it is checked on which hot spot the cursor 19 stays at present, in other words, which hot spot is being focussed on (S162).

The cursor transfer list 140 is then made reference to (S163) on the basis of the direction indicated by the cursor motion key 44 and the currently focussed hot spot, confirmed at steps S161 and S162, respectively. If a registered destination hot spot is found, the cursor (or focus) is transferred onto that hot spot (S165). For example, when the currently focussed hot spot is "E" and the cursor motion key indicates "DOWNWARD", then it can be read from the table 140 that the destination hot spot is "F". Therefore, the cursor is transferred onto the hot spot F (to the coordinate at the lower-right corner in this example).

If no destination hot spot exist at step S164 (in the case of "-"), this processing is ended by bypassing step S165.

Figure 8:
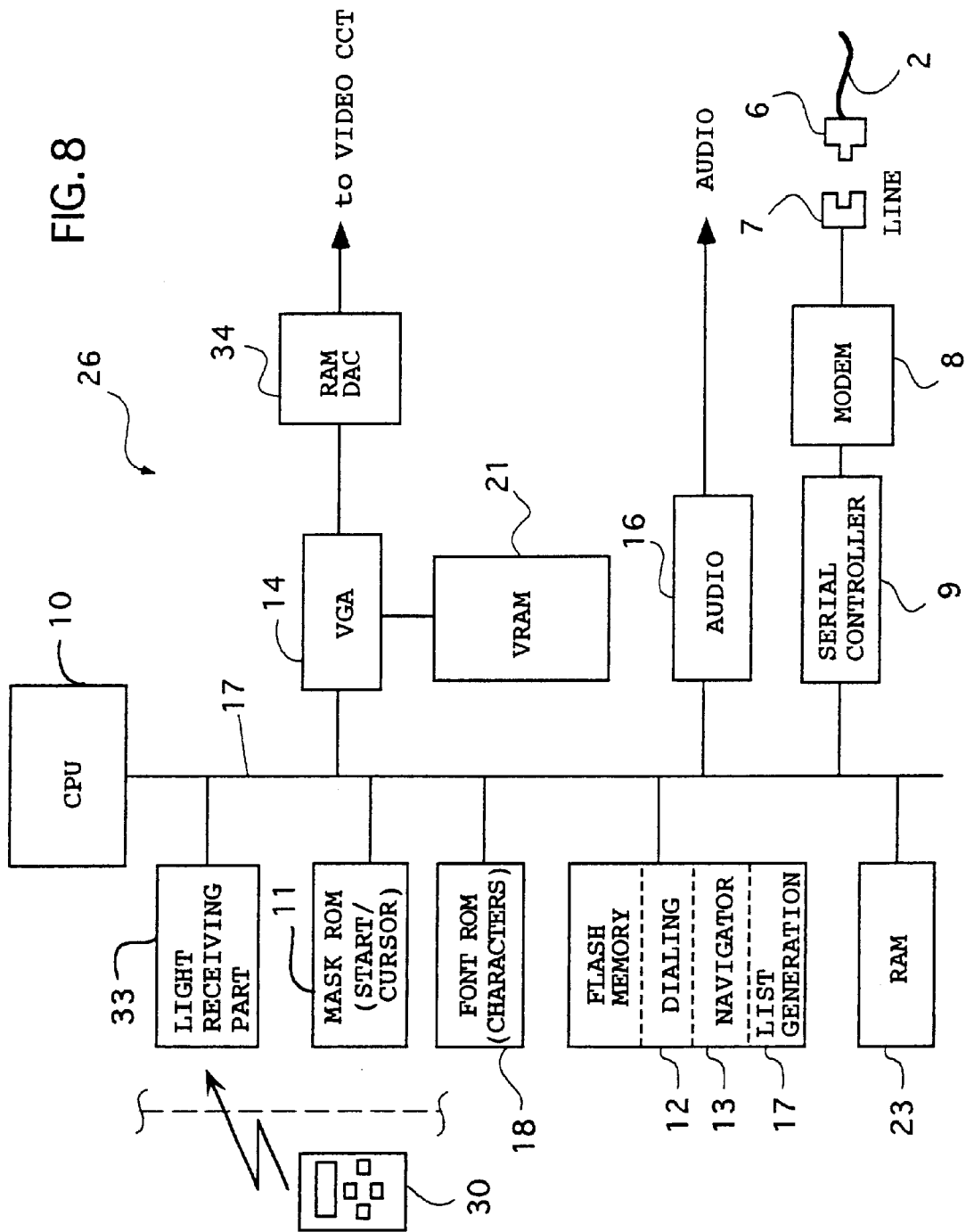
FIG. 8 is a block diagram showing a configuration of principal elements of the internet television apparatus in a second embodiment in accordance with the present invention.
Figure 9:
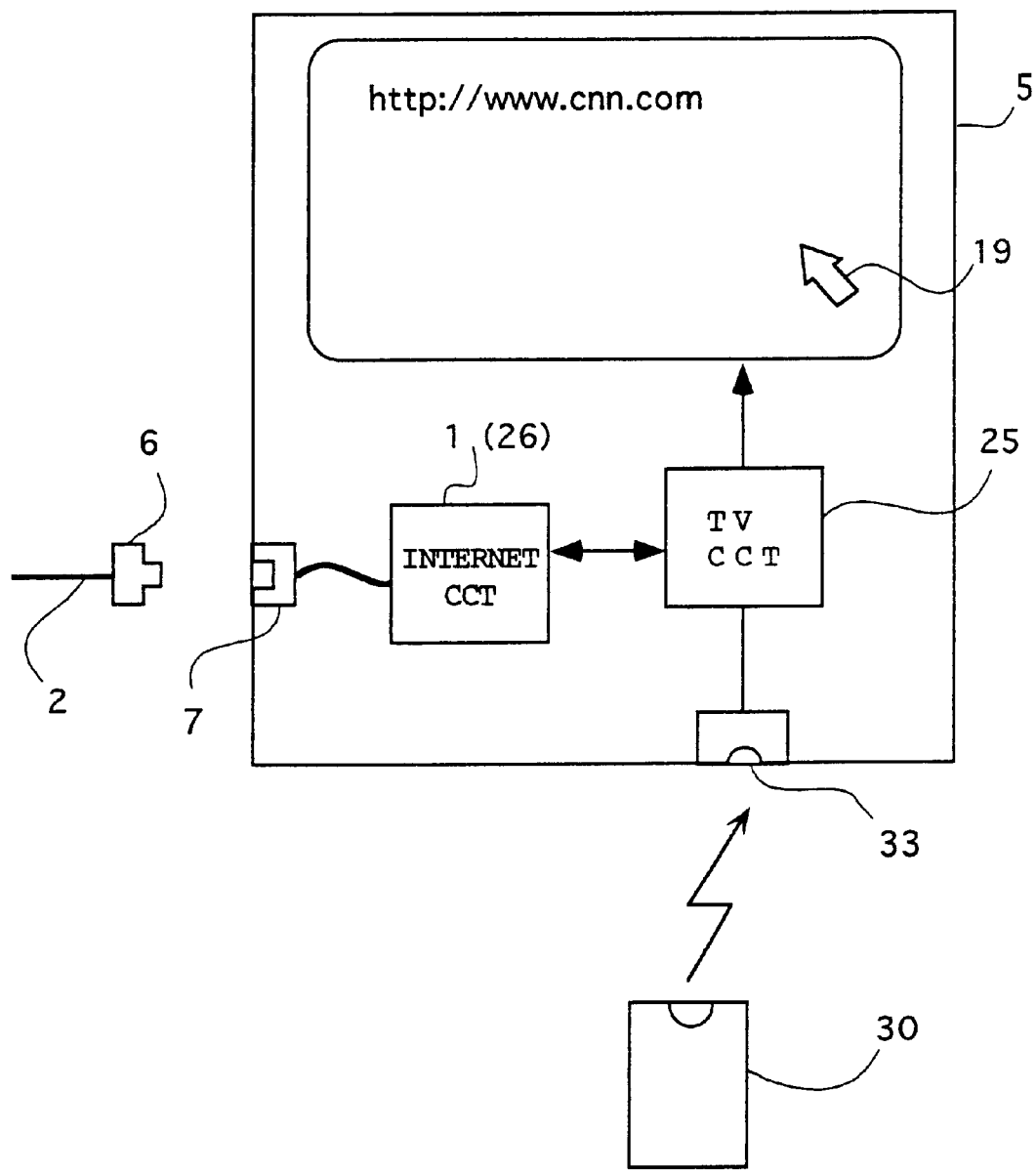
FIG. 9 is a schematic configuration diagram of an example of the internet television apparatus in the second embodiment in accordance with the present invention.

Next, a second embodiment is shown in FIGS. 8 and 9. In this second embodiment, the internal circuit of the internet unit 1 is incorporated in the television apparatus 5 at the manufacturing stage of the television apparatus 5, and the circuit configuration and operation are almost the same as those in the first embodiment except the appearance. As shown in FIG. 9, the television apparatus 5 is provided with a television circuit 25, an internet circuit 26, and a module jack 7. The interconnected configuration is almost the same as that in the first embodiment.

The remote controller 30 is also similar to the one used in the first embodiment, and in FIG. 8 a light receiving part 33 incorporates a remote receiver for converting an infrared signal into a digital signal and applying the signal to the CPU 10. The internet circuit 26 eliminates the need for the D/A converter circuit 22 in FIG.1, and audio data from the audio controller 16 are directly sent into the audio circuit of the television circuit 25, where the data are reconstructed into audio signals.

Further, since the internet circuit 26 requires no NTSC signal and generates no flickering, the flicker prevention circuit 15 in FIG. 5 is eliminated. Moreover, a RAMDAC 34 is used instead of the D/A converter circuit 22 in FIG. 5, and an image dot map on the RAMDAC is regularly refreshed and directly forwarded to the video circuit of the television circuit 25.

Figure 10:
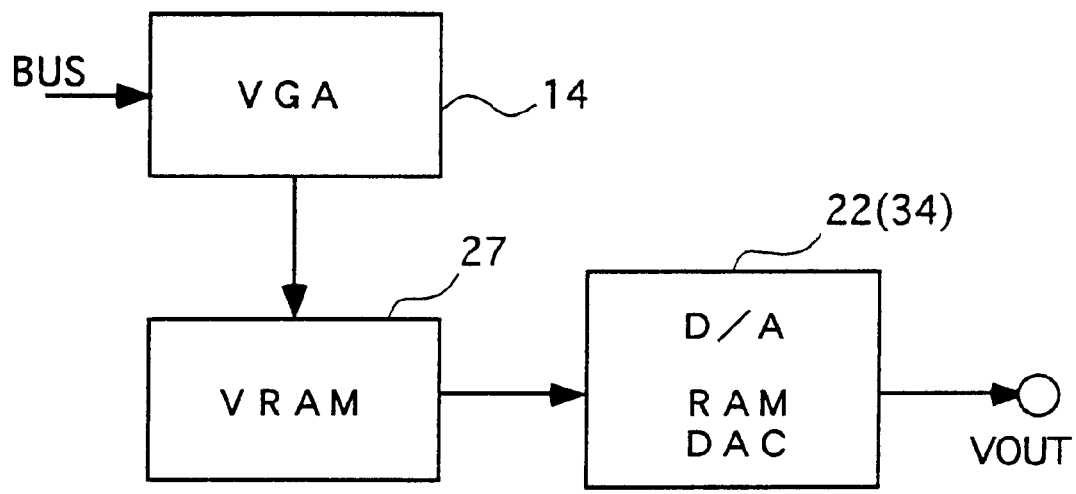
FIG. 10 shows an example of a video circuit of the internet television apparatus in accordance with the present invention.
Figure 11:
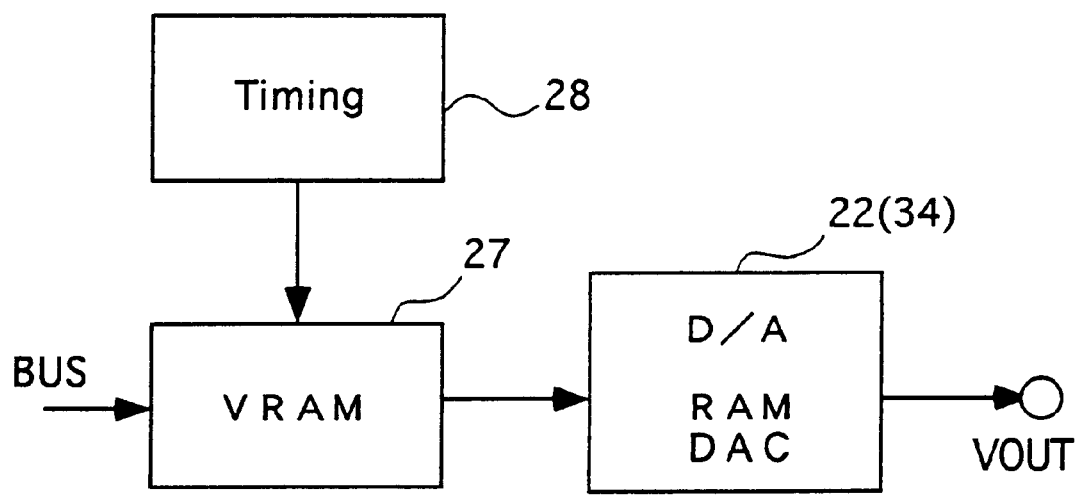
FIG. 11 shows another example of the video circuit of the internet television apparatus in accordance with the present invention.
Figure 12:
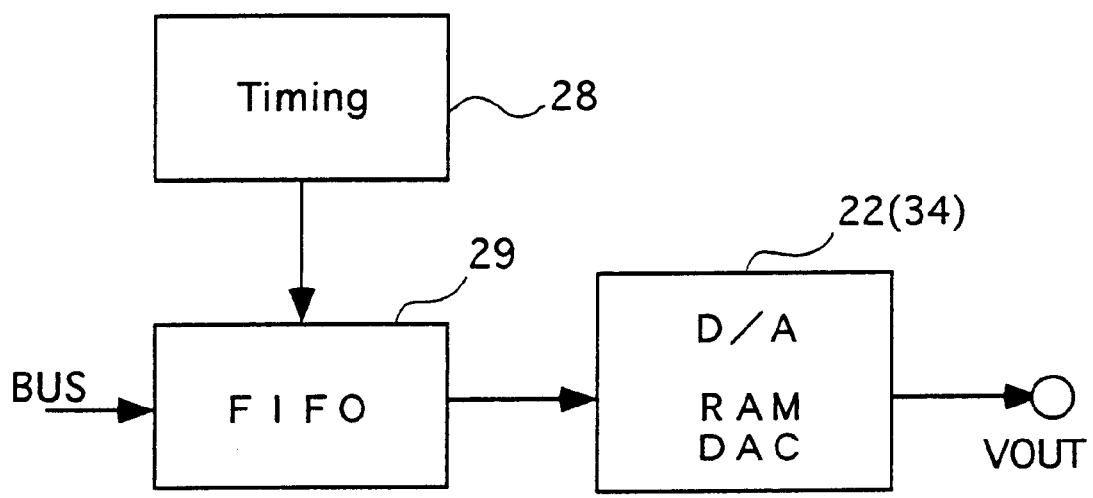
FIG. 12 shows yet another example of a video circuit of the internet television apparatus in accordance with the present invention.

Instead of the video circuits such as the video control circuit 14, the video RAM 21 and the D/A converter circuit 22 shown in FIG. 5, and the video control circuit 14, the video RAM 21 and the RAMDAC 34 shown in FIG. 8, other video circuits shown in FIG. 10 to FIG. 12 can be used.

In the video circuit of FIG. 10, the video control circuit (VGA) 14 processes picture data transferred from the CPU 10 via the bus 17 on the multiple port video RAM 27 to generate image data, and forwards the image data to the D/A converter circuit 22 in FIG. 5 and to the RAMDAC 34 in FIG. 8, respectively. Here, in FIG. 10 as well as in FIG. 5, the image data are generated by the video control circuit 14 and the multiple port video RAM 27, respectively, without burdening the CPU 10 with loads. The CPU 10 may be an inexpensive one, but the video control circuit 14 and the multiple port video RAM 27 need to be of relatively high performance.

In FIG. 11 and FIG. 12, a simple and inexpensive timing generator 28 is used in place of the video control circuit 14 in FIG. 10.

In the video circuit shown in FIG. 11, the CPU 10 processes picture data to generate image data, and this image data is forwarded via the bus to the multiple port video RAM 27 to be stored therein. The timing generator 28 sequentially reads the image data from the multiple port video RAM 27 and forwards the data to the D/A converter circuit 22 (RAMDAC 34). Unlike the case in FIG. 10, the image data is generated by the CPU 10, and, therefore, a relatively high performance CPU needs to be used.

Also in the video circuit in FIG. 12, the CPU processes picture data to generate image data, and this image data is forwarded via the bus to an FIFO memory 29 for being stored therein. The FIFO memory 29 is a first-in first-out memory, and the image data from the CPU 10 is simply and sequentially forwarded thereto by DMA transmission or the like for being stored therein, and is sequentially read in the order of older image data according to the timing signal from the timing generator 28. The timing generator 28 sequentially reads the image data from the FIFO memory 29 and applies the data to the D/A converter circuit 22 (RAMDAC 34). Also in this case, unlike the case in FIG. 10, a relatively high performance CPU needs to be used since the image data is generated by the CPU 10.

Although the above description has been made with reference to an example of obtaining HTML documents by accessing Web servers via a telephone line, the present invention is not limited to this. A modified example for obtaining HTML documents not via such a telephone line is shown in FIG. 17.

FIG. 17 shows an embodiment wherein a data broadcast receiving board 171 via ground wave or satellite is added to the first embodiment as shown in FIGS. 3 and 5. A similar arrangement can be added also to the second embodiment as shown in FIGS. 8 and 9. The present invention is also applicable as described above to a case where an HTML document is received through data broadcasting and if the received HTML document contains hot spots. Although it is not essential, in this case, to obtain an HTML document through a telephone line, the use of the both data acquisition methods makes it possible to transfer to a Web site that is linked in an HTML document received via the data broadcasting.

The above descriptions have been made on the preferred embodiments, but these are only exemplifications and the present invention is not to be limited to them and is applicable to variously modified and similar embodiments. For example, although the descriptions were made only on the television apparatus in the above embodiments, the present invention is applicable to any devices as long as they can display HTML documents even with no broadcast-receiving or Internet-accessing capability. Such devices include, for example, a display apparatuses for a control-use or a guide-use. Further, only the application to remote control buttons was described above, but the present invention is also applicable to a case where the operation is made using operation buttons provided on the display.

Industrial Applicability

According to the present invention, it is possible to provide an external internet unit or an internet circuit built-in a television apparatus, allowing even a user having no knowledge about personal computer operations, to perform the internet surfing, browsing news, and exchanging electronic mails, as if the user were remotely operating the television apparatus.

What is claimed is:

1. An Internet television apparatus having an Internet connecting capability, comprising:
   a connector for connecting to a Web server of the Internet;
   a storage unit for storing a markup language document received from the Web server;
   an interpreter for interpreting the markup language document and developing an image on an image memory;
   a display device for displaying the developed image thereon;
   a wireless remote controller having an operation key or keys for indicating at least four directions for remotely controlling the Internet television apparatus;
   a recognizer for recognizing, for each markup language document, anchor tags existing in the markup language document to detect mutual positional relationship among hot spots, corresponding to the recognized anchor tags, on a browser screen so as to generate a transfer list which defines, for each hot spot, indication of either no hot spot or a hot spot existing next to said each hot spot in respective directions capable of being indicated by said operation key or keys; and
   a control unit for determining to which hot spot a focus is to be transferred next from a currently focused hot spot, by referring to said transfer list on the basis of the currently focused hot spot and a user's operation to said operation key or keys for indicating at least four directions, and for transferring said focus to the determined hot spot.

2. The Internet television apparatus according to claim 1, comprising a receiver for receiving the markup language document through a telephone line.

3. The Internet television apparatus according to claim 1, comprising a receiver for receiving the markup language document from a data broadcasting.

4. The Internet television apparatus according to claim 1, wherein the focusing is achieved by displaying a cursor placed on a hot spot to be focused on.

5. The Internet television apparatus according to claim 1, wherein the focusing is achieved by an enhancement display of a hot spot to be focused on.

6. An external device to be connected to a television apparatus for providing the same with an Internet accessing capability, comprising:
   a connector for connecting to a Web server of the Internet;
   a storage unit for storing a markup language document received from the Web server;
   an interpreter for interpreting the markup language document and developing an image on an image memory;
   a transmitter for transmitting the developed image to said television apparatus;
   a wireless remote controller which has an operation key or keys for indicating at least four directions and remotely control said external device;
   a recognizer for recognizing, for each markup language document, anchor tags existing in the markup language document to detect the mutual positional relationship among hot spots, corresponding to the recognized anchor tags, on a browser screen so as to generate a transfer list which defines, for each hot spot, indication of either no hot spot or a hot spot existing next to said each hot spot in respective directions capable of being indicated by said operation key or keys; and
   a control unit which refers to said transfer list in response to a user's operation to the operation key or keys for indicating at least four directions and in response to a currently focused hot spot, so as to determine to which hot spot the focus is to be transferred next from the current hot spot, and to transfer the focus onto the determined hot spot.

7. The external device according to claim 6, characterized in that said remote controller is used in common as that for said television apparatus.

8. The external device according to claim 6, comprising a receiver for receiving the markup language document through a telephone line.

9. The external device according to claim 6, comprising a receiver for receiving the markup language document from a data broadcasting.

10. The external device according to claim 6, wherein the focusing is achieved by displaying a cursor placed on a hot spot to be focused on.

11. The external device according to claim 6, wherein the focusing is achieved by an enhancement display of a hot spot to be focused on.

12. A method of transferring, by key operation, a focus to a plurality of hot spots on a browser screen displaying a markup language document, in a device with a display for displaying the markup language document, comprising the steps of:

receiving the markup language document;

recognizing, for each markup language document, anchor tags existing in the markup language document received;

detecting the mutual positional relationship among hot spots, corresponding to the recognized anchor tags, on a browser screen so as to generate a transfer list which defines, for each hot spot, indication of either no hot spot or a hot spot existing next to said each hot spot in respective directions capable of being indicated by said operation key or keys;

determining to which hot spot the focus is to be transferred next from a current hot spot by referring to the transfer list in accordance with the operation taken by the user to the operation key or keys for indicating at least four directions and with the hot spot currently focused on; and transferring the focus onto the determined hot spot.

13. A recording medium recording a computer program for achieving a method of transferring by, key operation, a focus to a plurality of hot spots on a browser screen displaying a markup language document on a device with a display for displaying the markup language document, the method comprising the steps of:

receiving the markup language document;

recognizing, for each markup language document, anchor tags existing in the markup language document received;

detecting the mutual positional relationship among hot spots, corresponding to the recognized anchor tags, on a browser screen so as to generate a transfer list which defines, for each hot spot, indication of either no hot spot or a hot spot existing next to said each hot spot in respective directions capable of being indicated by said operation key or keys;

determining to which hot spot the focus is to be transferred next from a current hot spot by referring to said transfer list in response to a user's operation to said operation key or keys for indicating at least four directions and the currently focused hot spot; and transferring the focus onto the determined hot spot.

14. The recording medium according to claim 13, wherein said transfer list is generated to further define for one or more of said hot spots, coordinates of at least one diagonal point of said hot spot.

15. An Internet unit having an Internet connecting capability, comprising:

a connector for connecting to a web server of the Internet;

a storage unit for storing a markup language document received from the Web server;

an interpreter for interpreting the markup language document and developing an image on an image memory;

a display device for displaying the developed image thereon;

an operation key or keys for indicating at least four directions for controlling the Internet apparatus;

a recognizer for recognizing, for each markup language document, anchor tags existing in the markup language document to detect mutual positional relationship among hot spots, corresponding to the recognized anchor tags, on a browser screen so as to generate a transfer list which defines, for each hot spot, indication of either no hot spot or a hot spot existing next to said each hot spot in each direction capable of being indicated by said operation key or keys; and a control unit for determining to which hot spot a focus is to be transferred next from a currently focused hot spot, by referring to said transfer list on the basis of the currently focused hot spot and a user's operation to said operation key or keys for indicating at least four directions, and for transferring said focus to the determined hot spot.

16. The Internet unit according to claim 15, wherein said transfer list further defines for one or more of said hot spots, coordinates of at least one diagonal point of said hot spot.

17. The Internet television apparatus according to claim 1, wherein said transfer list further defines for one or more of said hot spots, coordinates of at least one diagonal point of said hot spot.

18. The device according to claim 6, wherein said transfer list further defines for one or more of said hot spots, coordinates of at least one diagonal point of said hot spot.

19. The method according to claim 12, wherein said transfer list is generated to further define for one or more of said hot spots, coordinates of at least one diagonal point of said hot spot.

* * * * *